(12) United States Patent
Ajersch et al.

(10) Patent No.: US 12,449,616 B2
(45) Date of Patent: Oct. 21, 2025

(54) COOLING ASSEMBLY AND METHOD FOR USER-FACING SURFACES OF A PLUGGABLE OPTICAL MODULE

(71) Applicant: Ciena Corporation, Hanover, MD (US)

(72) Inventors: Peter Ajersch, Dunrobin (CA); Trevor Meunier, Kemptville (CA); Mitchell O'Leary, Ottawa (CA)

(73) Assignee: Ciena Corporation, Hanover, MD (US)

( * ) Notice: Subject to any disclaimer, the term of this patent is extended or adjusted under 35 U.S.C. 154(b) by 329 days.

(21) Appl. No.: 18/133,011

(22) Filed: Apr. 11, 2023

(65) Prior Publication Data
US 2024/0345342 A1    Oct. 17, 2024

(51) Int. Cl.
*G02B 6/42* (2006.01)

(52) U.S. Cl.
CPC ......... *G02B 6/4269* (2013.01); *G02B 6/4277* (2013.01)

(58) Field of Classification Search
CPC ............................ G02B 6/4269; G02B 6/4277
See application file for complete search history.

(56) References Cited

U.S. PATENT DOCUMENTS

| | | | |
|---|---|---|---|
| 6,198,630 B1* | 3/2001 | Cromwell | H05K 7/1431 174/16.3 |
| 9,666,995 B1* | 5/2017 | Phillips | H01R 13/6594 |
| 10,104,760 B1* | 10/2018 | Briant | G02B 6/4284 |
| 10,945,357 B2* | 3/2021 | Chopra | G02B 6/4261 |
| 11,271,348 B1* | 3/2022 | Chen | H01R 12/724 |
| 11,357,132 B2* | 6/2022 | Chopra | H05K 7/20136 |
| 2009/0016685 A1* | 1/2009 | Hudgins | H04B 10/40 385/92 |
| 2009/0323282 A1* | 12/2009 | Holdredge | H05K 9/0041 361/818 |
| 2014/0056592 A1* | 2/2014 | McColloch | H04B 10/40 29/428 |
| 2016/0211620 A1* | 7/2016 | Sharf | H01R 12/724 |
| 2018/0199460 A1* | 7/2018 | Wu | H01L 23/42 |
| 2019/0235187 A1* | 8/2019 | Talebzadeh | G02B 6/428 |
| 2019/0326703 A1* | 10/2019 | Chen | H01R 12/53 |
| 2020/0113077 A1* | 4/2020 | Tittenhofer | H05K 5/0256 |
| 2020/0275587 A1* | 8/2020 | Chopra | H05K 9/0058 |
| 2022/0082771 A1* | 3/2022 | Galbraith | H01R 12/722 |
| 2022/0302651 A1* | 9/2022 | Long | H01R 13/6581 |
| 2023/0258891 A1* | 8/2023 | Gupta | H05K 7/20409 361/688 |
| 2023/0324054 A1* | 10/2023 | Handa | H05K 7/2039 361/699 |
| 2023/0422449 A1* | 12/2023 | Liu | H05K 7/2049 |

* cited by examiner

*Primary Examiner* — Stephen S Sul
(74) *Attorney, Agent, or Firm* — Clements Bernard Walker; Christopher L. Bernard

(57) ABSTRACT

An optical system including: a faceplate including a receptacle adapted to receive a pluggable optical module; and one or more of: a thermal pad disposed adjacent to at least one interior side of the receptacle, wherein the thermal pad is adapted to be in thermal communication with the pluggable optical module when the pluggable optical module is received within the receptacle and conduct heat from a nose of the pluggable optical module to the faceplate; and a heat sink disposed at an interior side of the receptacle, wherein the heatsink is adapted to be in physical contact and thermal communication with the pluggable optical module when the pluggable optical module is received within the receptacle and conduct heat from the nose of the pluggable optical module to an air flow present behind the faceplate.

11 Claims, 9 Drawing Sheets

COOLING ASSEMBLY AND METHOD FOR USER-FACING SURFACES OF A PLUGGABLE OPTICAL MODULE

TECHNICAL FIELD

The present disclosure relates generally to the telecommunications and optical networking equipment fields. More particularly, the present disclosure relates to cooling assemblies and methods for the user-facing surfaces of a pluggable optical module (POM).

BACKGROUND

POMs are designed to be cooled via a number of conventional paths. The case top behind the faceplate is typically in contact with a heat sink (or cold plate), which may be air or liquid-cooled inside the module. Typically, design efforts are made to minimize the contact resistance between the case top and the heat sink (or cold plate). The heat sink (or cold plate) effectiveness, and temperature, depends on system design choices; e.g., fin pitch, air speed, etc.

Further, the case bottom behind the faceplate may be thermally coupled to the printed circuit board (PCB) by virtue of its proximity to the PCB and the narrow air gap between the case bottom and the PCB. While this is typically not a low-resistance thermal interface, it is a useful secondary thermal path.

Further, the case bottom behind the faceplate may optionally be cooled by a heat sink (or cold plate) that is in surface-to-surface contact, similar to the case top heat sink (or cold plate). This strategy entails designing an opening in the PCB under the POM so that the heat sink (or cold plate) on the far side of the PCB can reach through to make contact with the case bottom.

Further, the "nose" of the POM is typically cooled by the surrounding air, and POMs often have fins designed into the nose to improve the convective heat transfer between the nose and the surrounding air. This thermal path is more effective when the system air flow is "front-to-back" along the length of the POM; i.e., the dominant air flow direction is from the region in front of the POM (the end with the fiber or cable connections) toward the region at the rear of the POM (the end with the PCB electrical connector). This thermal path has relatively poor value when the system air flow is "side-to-side" relative to the POM; i.e., the POM mounts to a circuit card, or blade, whereby, in the region behind the circuit card faceplate, the system flow is forced convection from one side to another side, along the short width of the POM, while in the region in front of the circuit card faceplate there is little or no forced convection. As used herein, "nose" is defined as that portion of the POM that lies in the region forward of the circuit card faceplate.

A general challenge in cooling POMs is that it must be possible to freely insert and remove the POMs from the system. This means that no permanently-attached heat sink (or cold plate) is permitted. The case-top and case-bottom heat sinks (or cold plates) are typically sprung against the case with some nominal pressure, often between 3 and 8 psi. Higher heat sink (or cold plate) pressure is problematic because high pressure results in insertion and removal forces that are excessive from the end-user perspective.

In certain applications; e.g., those with side-to-side air flow; heat transfer from the nose of the POM is relatively poor. In such applications (system designs), there is no built-in strategy for drawing significant heat away from the nose that extends outside of the module (beyond the faceplate) where the user interfaces exist. This becomes particularly challenging, thermally, when components and/or sub-assemblies in the nose; e.g., photonics parts; are the very components that limit POM function at high temperatures, given applicable operational thermal limits.

SUMMARY

The present disclosure provides for conductive cooling from the nose of a hot POM in the area of a system faceplate to the colder circuit card faceplate in a system relying primarily on side-to-side air flow cooling.

In one aspect, a thermally filled gap is provided between the POM nose and the colder circuit pack faceplate, with a durable slide cover provided to handle multiple POM insertions/removals. This thermally filled gap can be implemented in various ways, with elasticity, low-compression set, durability, etc. Two specific implementations are provided herein, namely a graphite-over-foam (GOF) thermal pad and a soft gap pad. The GOF thermal pad with a formed guide/lead is disposed along the sides of the POM and secured to the faceplate, with an optional bullnose extension of the faceplate provided for increased contact area. The guide/lead may be manufactured from sheet metal, Cu, Al, steel, graphite, etc., serving primarily to protect the more delicate thermal pad beneath.

In another aspect, a heat sink is provided in the area of the faceplate in sliding contact with the POM nose. Fins or the like protrude into the side-to-side air flow inside the module. An electromagnetic interference (EMI)-compliant gasket is provided around the hole into the module (or an EMI-compliant hole pattern is utilized). Springs are provided on either side of the heat sink to provide contact force with the inserted POM. A front retention plate coupled to the faceplate may be used to hold the heat sink in place on the faceplate, optionally covered by the module label.

In a further aspect, "mouse bites" or air flow passages are provided in the faceplate structure around the POM to enhance air flow from the outside ambient to the rear of the faceplate space. The airflow passages are sized to be waveguides, such that the system Faraday cage is uncompromised.

In one illustrative embodiment, the present disclosure provides an optical system including: a faceplate including a receptacle adapted to receive a pluggable optical module; and a thermal pad disposed adjacent to at least one interior side of the receptacle, wherein the thermal pad is adapted to be in thermal communication with the pluggable optical module when the pluggable optical module is received within the receptacle and conduct heat from a nose of the pluggable optical module to the faceplate. The thermal pad includes a graphite-over-foam pad or the like. The optical system also includes a durable slide cover disposed over the thermal pad and affixed to the faceplate and adapted to be in physical contact with the pluggable optical module when the pluggable optical module is received within the receptacle, the durable slide cover thereby adapted to protect the underlying thermal pad from damage caused by the pluggable optical module when the pluggable optical module is inserted into and removed from the receptacle. At least one side of the receptacle optionally includes a bullnose extension extending from a user-facing surface of the faceplate. The faceplate optionally defines one or more openings in proximity to the receptacle adapted to allow air flow between a user-facing side and a back side of the faceplate. Each of the one or more openings is sized to allow air flow but act as a waveguide to maintain electromagnetic shielding of the optical system by the faceplate.

In another illustrative embodiment, the present disclosure provides an optical system including: a faceplate including a receptacle adapted to receive a pluggable optical module; and a heat sink disposed at an interior side of the receptacle, wherein the heatsink is adapted to be in physical contact and thermal communication with the pluggable optical module when the pluggable optical module is received within the receptacle and conduct heat from a nose of the pluggable optical module to an air flow present behind the faceplate. The heat sink includes a chamfer formed along a front edge of the heat sink adapted to receive the pluggable optical module when the pluggable optical module is inserted into the receptacle. The heat sink includes a planar surface adapted to contact the pluggable optical module when the pluggable optical module is received within the receptacle and a plurality of fins, pins, or other protruding structures extending from the planar surface through an opening formed in a wall of the receptacle, the plurality of fins, pins, or other protruding structures extending into the air flow present behind the faceplate. The optical system also includes one or more spring members disposed between the planar surface of the heat sink and the wall of the receptacle and adapted to bias the planar surface into the pluggable optical module when the pluggable optical module is received within the receptacle. The optical system further includes an electromagnetic interference gasket disposed between the planar surface of the heat sink and the wall of the receptacle around the opening and the plurality of fins, pins, or other protruding structures. The faceplate optionally defines one or more openings in proximity to the receptacle adapted to allow air flow between a user-facing side and a back side of the faceplate. Each of the one or more openings is sized to allow air flow but act as a waveguide to maintain electromagnetic shielding of the optical system by the faceplate.

In a further illustrative embodiment, the present disclosure provides an optical system including: a faceplate including a receptacle adapted to receive a pluggable optical module; and one or more of: a thermal pad disposed adjacent to at least one interior side of the receptacle, wherein the thermal pad is adapted to be in thermal communication with the pluggable optical module when the pluggable optical module is received within the receptacle and conduct heat from a nose of the pluggable optical module to the faceplate; and a heat sink disposed at an interior side of the receptacle, wherein the heatsink is adapted to be in physical contact and thermal communication with the pluggable optical module when the pluggable optical module is received within the receptacle and conduct heat from the nose of the pluggable optical module to an air flow present behind the faceplate. The thermal pad includes a graphite-over-foam pad or the like. The optical system may also include a durable slide cover disposed over the thermal pad and affixed to the faceplate and adapted to be in physical contact with the pluggable optical module when the pluggable optical module is received within the receptacle, the durable slide cover thereby adapted to protect the underlying thermal pad from damage caused by the pluggable optical module when the pluggable optical module is inserted into and removed from the receptacle. At least one side of the receptacle optionally includes a bullnose extension extending from a user-facing surface of the faceplate. The heat sink includes a planar surface adapted to contact the pluggable optical module when the pluggable optical module is received within the receptacle and a plurality of fins, pins, or other protruding structures extending from the planar surface through an opening formed in a wall of the receptacle, the plurality of fins, pins, or other protruding structures extending into the air flow present behind the faceplate. The optical system may further include: one or more spring members disposed between the planar surface of the heat sink and the wall of the receptacle and adapted to bias the planar surface into the pluggable optical module when the pluggable optical module is received within the receptacle; and an electromagnetic interference gasket disposed between the planar surface of the heat sink and the wall of the receptacle around the opening and the plurality of fins, pins, or other protruding structures. The faceplate optionally defines one or more openings in proximity to the receptacle adapted to allow air flow between a user-facing side and a back side of the faceplate, wherein each of the one or more openings is sized to allow air flow but act as a waveguide to maintain electromagnetic shielding of the optical system by the faceplate.

DETAILED DESCRIPTION OF THE DRAWINGS

The present disclosure is illustrated and described with reference to the various drawings, in which like reference numbers are used to denote like system/assembly components and/or method steps, as appropriate, and in which.

It will be readily apparent that aspects and embodiments illustrated in the present disclosure may be utilized individually or combined as desired in a given application.

DETAILED DESCRIPTION

Figure 8:
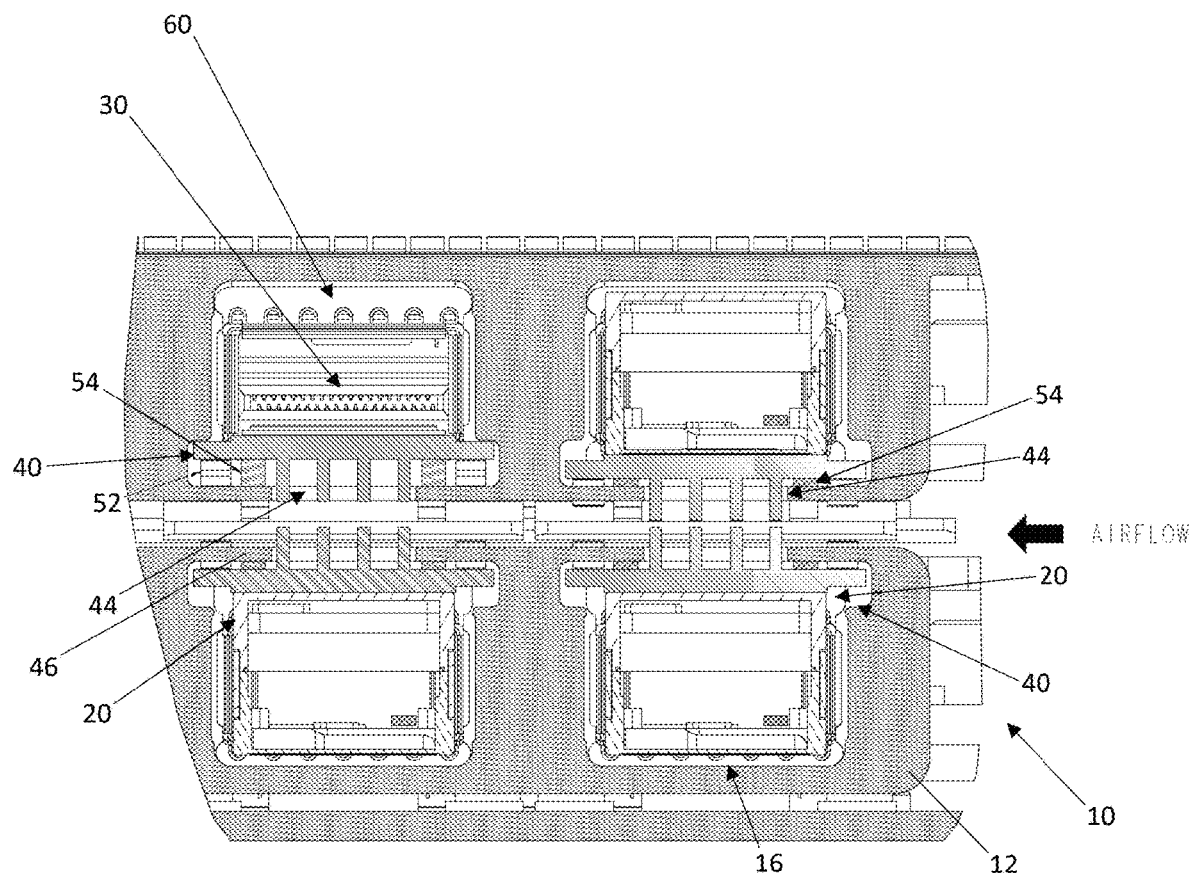
FIG. 8 is a partial cross-sectional view of the system of FIG. 7, highlighting the faceplate heat sinks and "mouse bites" of the present disclosure.

The present disclosure addresses cooling involving the user-facing surfaces of POMs external to the Faraday cage of the associated module. Most current POM designs assume that air flow is front-to-back through the faceplate of a module in the system. In such cases, these user-facing surfaces typically see adequate air flow from the system to be cooled effectively. However, in a cross air flow system, where substantially no air passes through the faceplate of the module and is constrained within the Faraday cage, only minimal natural convection cooling is typically achieved from the user-facing surfaces of the POMs. By implementing the features of the present disclosure, natural convection is no longer the primary cooling mechanism of a user-facing POM nose. If the thermal pad approach of the present disclosure is used, heat is conducted through the thermal pad to the cool faceplate, which is in turn cooled by the forced convection system air flow inside the module. If the heat sink of the present disclosure is used, the same principle applies, except that the heat transfer is more direct from the conductive contact between a POM and the associated heat sink, the heat sink being cooled by a forced convection system air flow inside the module. FIG. 8 generally illustrates the air flow direction within the system as it applies to all embodiments of the present disclosure. Further, the present disclosure provides ingress of air flow through the faceplate via openings adjacent to an EMI gasket, while serving to cool a surface outside the faceplate and continuing to meet the EMI shielding requirements.

Figure 1:
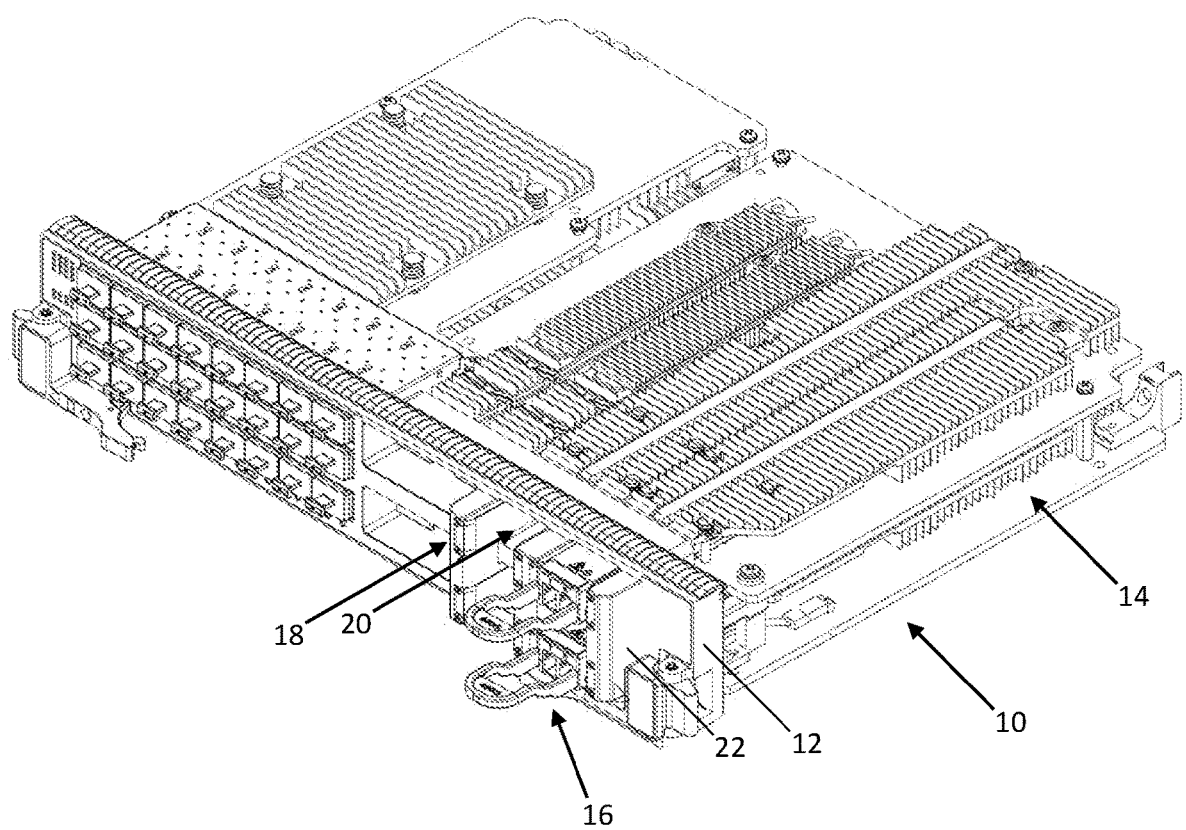
FIG. 1 is a perspective view of an optical system (circuit card) including a plurality of POMs, the system utilizing one illustrative embodiment of the bullnose extension faceplate and the thermal pads of the present disclosure.
Figure 2:
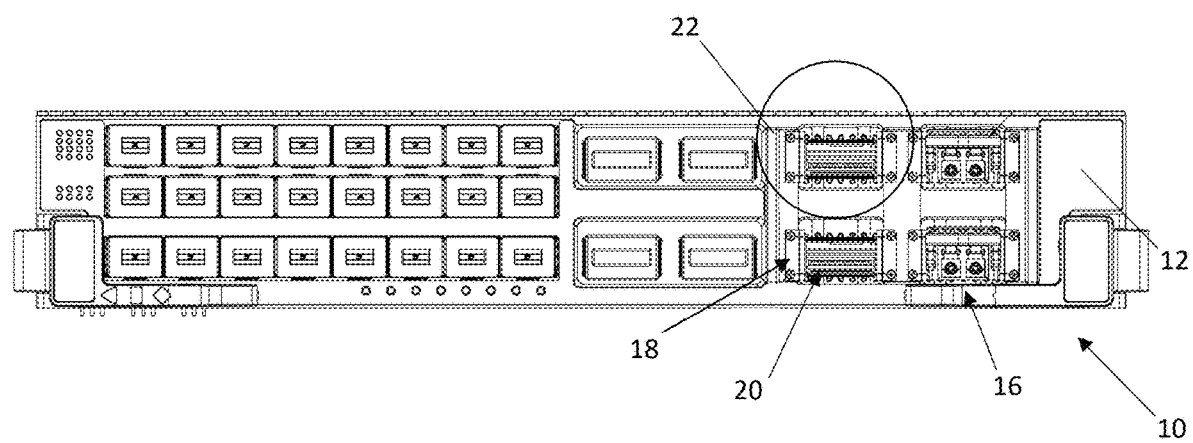
FIG. 2 is a front planar view of the system of FIG. 1.

Referring specifically to FIGS. 1 and 2, in one illustrative embodiment, the module 10 includes the faceplate 12 disposed in front of the PCBs 14 of the module 10 that effectively acts as a cold plate for each inserted POM 16 because the faceplate 12 interfaces with the ambient environment and is generally not heated via other cooling uses. Thus, the faceplate 12 typically has a temperature that is equal to or only slightly higher than the ambient environment. Heat from the nose of the POM 16—the region to be cooled—is thus conducted to the faceplate 12. Considering that the POM 16 is a device that is intended to be inserted and removed freely multiple times, and that there is always a small uncertainty in the gap width between POM and receptacle side wall, key attributes of the present disclosure include: thermal conductivity, elasticity, low compression set, low static and kinetic friction, and robustness.

Accordingly, a thermal bridge assembly 18 is disposed on opposed sides of the receptacle 20 in which the POM 16 is received when coupled to the module 10. This thermal bridge assembly 18 may also be disposed on either side of a bullnose extension 22 coupled to or integrally formed in the user-facing side of the faceplate 12, effectively extending the receptacle 20 in which the POM 16 is received in the user-facing direction. As is described in greater detail herein, the thermal bridge assembly 18 contacts the opposed sides of the associated POM 16, filling the air gap that may typically be present, and provides a thermal path from the nose of the POM 16 to the faceplate 12, optionally along the length of the associated bullnose extension 22. It should be noted that, in the embodiment illustrated, a plurality of POMs 16 are utilized, with a bullnose extension 22 and a thermal bridge assembly 18 disposed on either side of each POM 16 on the user-facing side of the faceplate 12.

Figure 3:
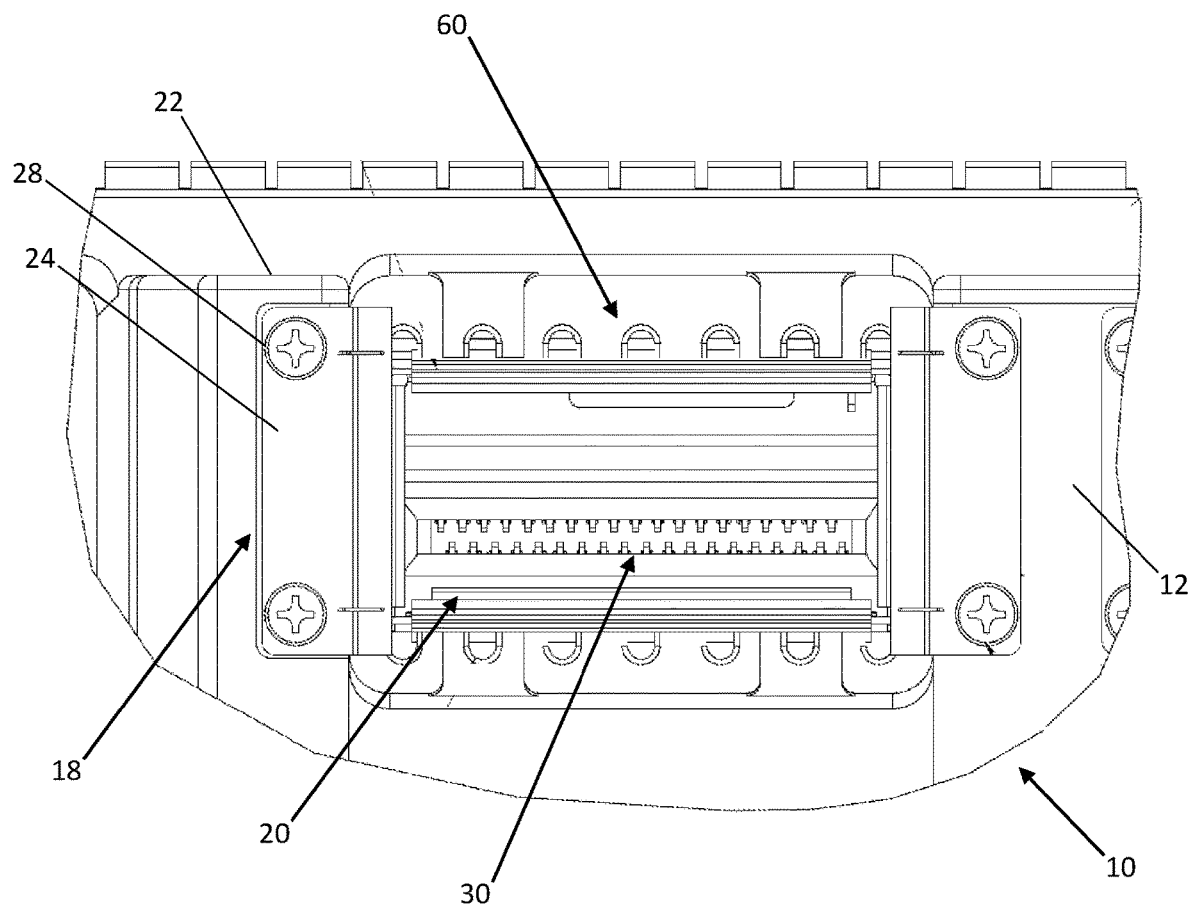
FIG. 3 is a partial front planar view of the system of FIG. 1, highlighting the thermal pads and "mouse bites" of the present disclosure.

Referring to FIG. 3, the thermal bridge assembly 18 includes a durable slide cover 24 that acts as a low-friction bearing surface when the associated POM 16 (FIGS. 1 and 2) is inserted or removed. This durable slide cover 24 serves to contain and protect the underlying thermal pad 26 (FIGS. 4 and 5) such that the thermal pad 26 is not peeled away, torn, cut, gouged, or otherwise degraded as the POM is repeatedly inserted/removed from the faceplate 12—the durable slide cover 24 making contact with the POM 16. As illustrated, the durable slide covers 24 may be affixed to the faceplate 12 or the ends of the bullnose extensions 22 using screws, bolts, or the like 28 and thereby, at least in part, are secured to the sides of the receptacle(s) 20.

Figure 4:
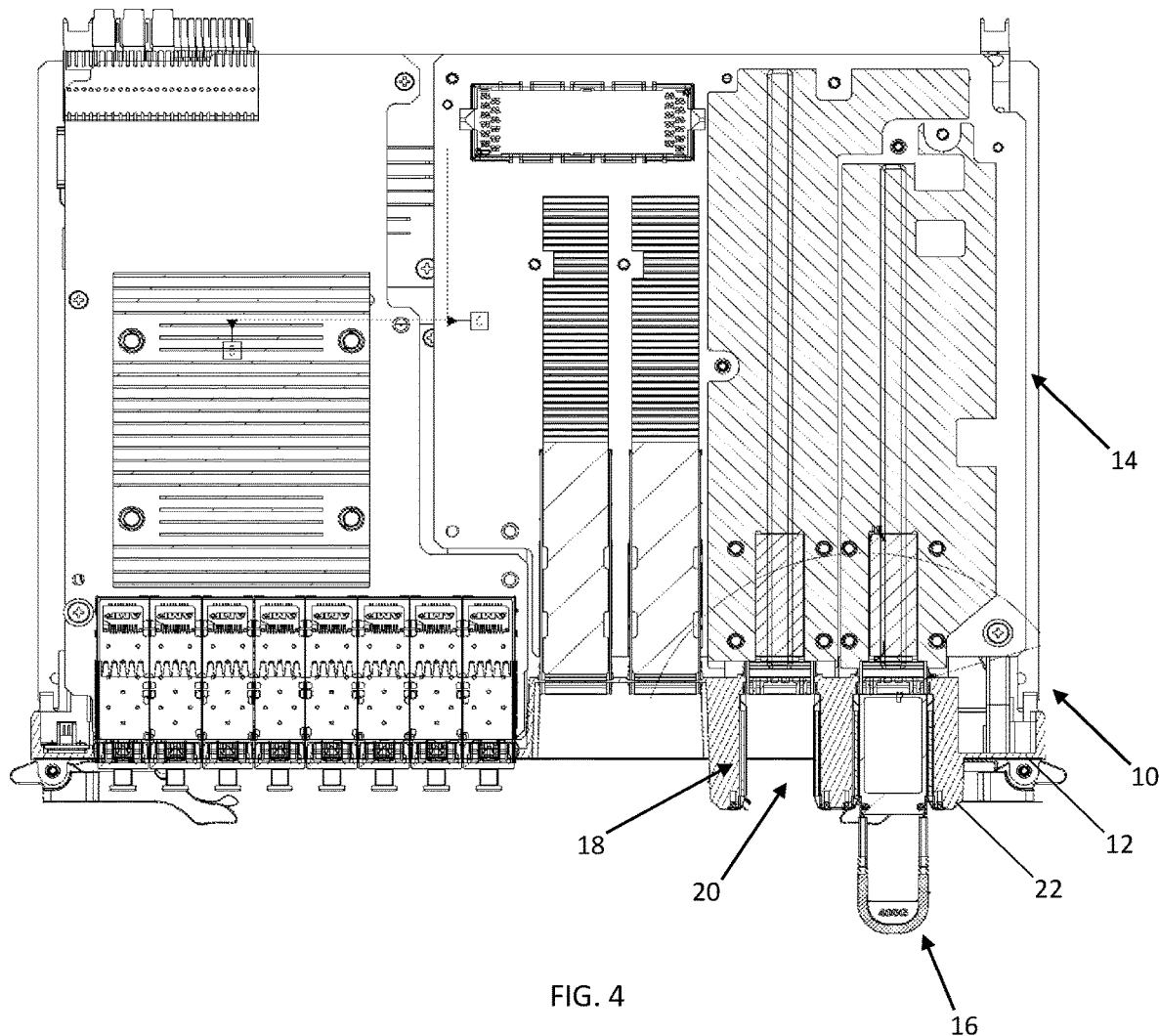
FIG. 4 is a top cross-sectional view of the system of FIG. 1.
Figure 5:
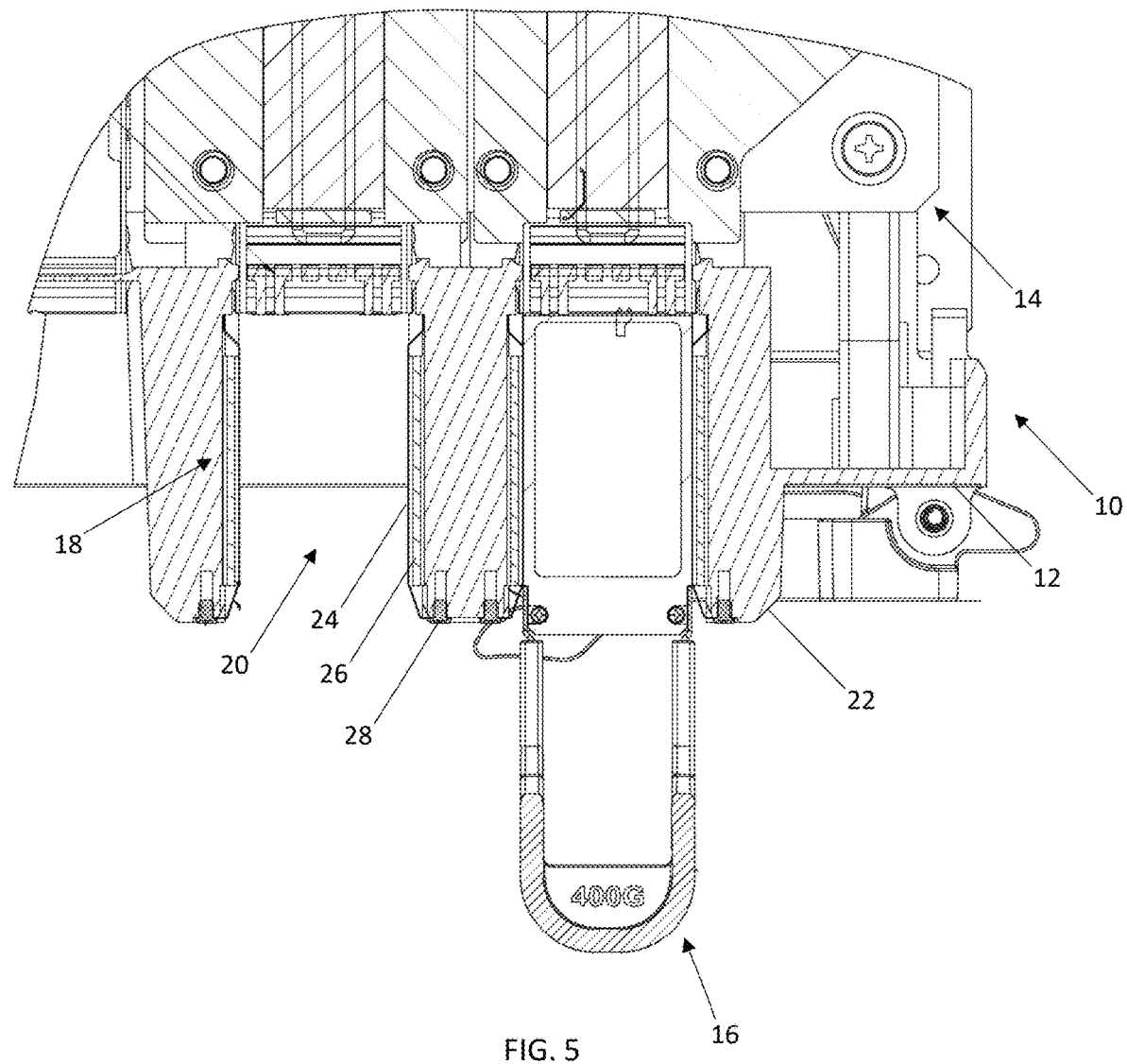
FIG. 5 is a partial top cross-sectional view of the system of FIG. 1.

Referring to FIGS. 4 and 5, the durable slide cover 24 of the thermal bridge assembly 18 covers, contains, and secures the underlying thermal pad 26 to the associated wall of the receptacle 20 and the bullnose extension 22, when used, via the screws, bolts, or the like 28. The thermal pad 26 is a soft elastic pad that provides low thermal resistance. For example, a GOF pad may be used to provide the desired heat transfer path from the nose of the POM 16 to the faceplate 12 along the bullnose extension 22 through the space that would otherwise be an insulator; e.g. air. The softness and elasticity of the thermal pad 26 enables this gap to be filled under all conditions; e.g. a realistic example might be a 2.0 mm gap between the nose of the POM 16 and the faceplate 12, with a ±0.4 mm uncertainty. The durable slide cover 24 is constructed of a thin material with good thermal conductivity so as not to introduce a significant thermal resistance to the heat transfer path.

Figure 6:
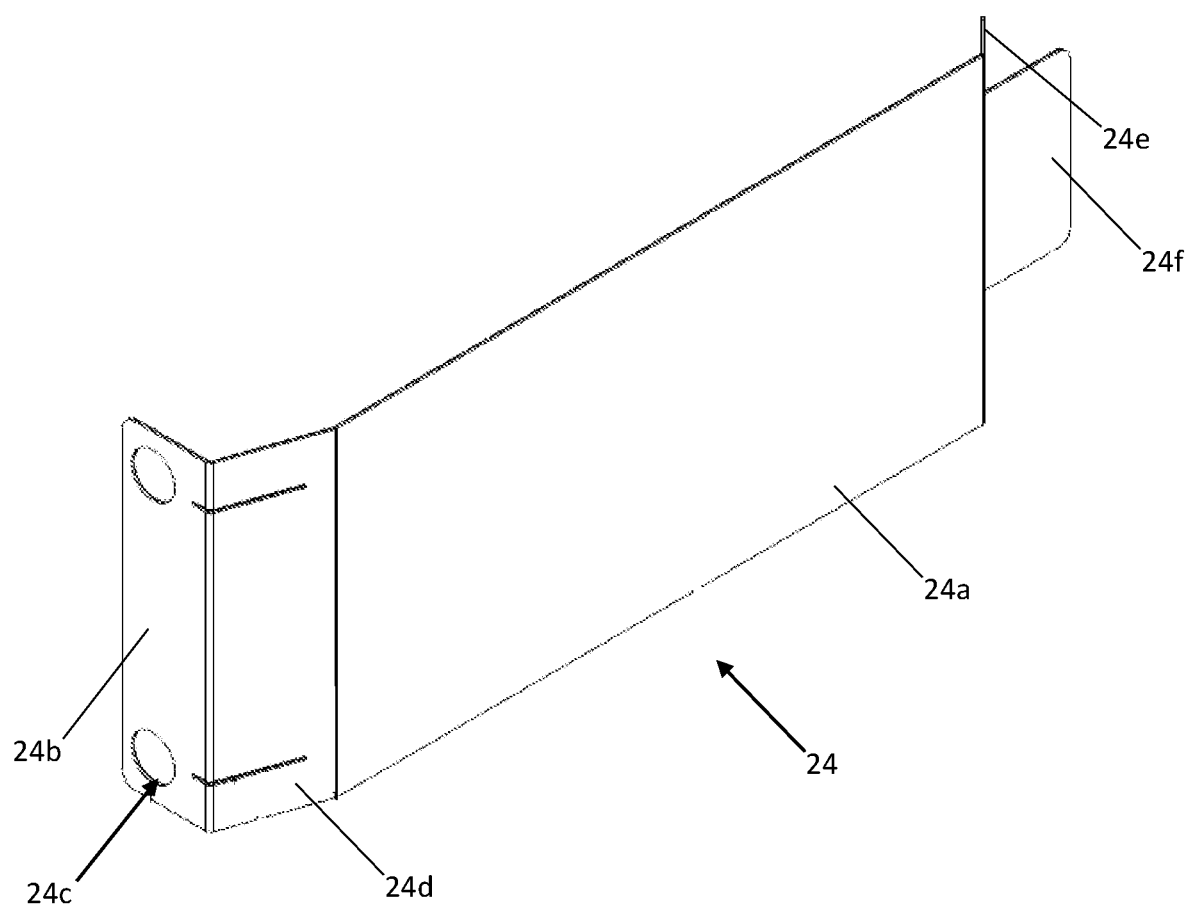
FIG. 6 is a perspective view of one illustrative embodiment of the guide/lead of the thermal pads of FIG. 1.

Referring to FIG. 6, the durable slide cover 24, which is made of a thermally-conductive metallic material, for example, includes a planar spanning portion 24a that covers the bulk of the associated side of the POM-receiving receptacle 20 (FIGS. 1-5) and the bullnose extension 22 (FIGS. 1-5) (when used) of the faceplate 12 (FIGS. 1-5), providing the sliding contact surface with the sides of the associated POM 16 (FIGS. 1, 2, 4, and 5) and protectively encompassing the underlying thermal pad 26 (FIG. 5). This planar spanning portion provides the bulk of the thermal communication path between the nose of the POM 16 and the faceplate 12. The durable slide cover 24 also includes an attachment portion 24b disposed at an angle (e.g., perpendicular) to the planar spanning portion 24a. The attachment portion includes one or more holes for receiving the screws, bolts, or the like 28 (FIGS. 3 and 5) that are used to couple the durable slide cover 24 to the faceplate 12 and/or bullnose extension 22. Optionally, the attachment portion 24b is coupled to the planar spanning portion 24a by an intervening angled portion 24d. An end angled portion 24e may also be provided at an opposite end of the planar spanning portion 24a. Together, the intervening angled portion 24d and the end angled portion 24e may collectively define a space in which the thermal pad 26 is disposed adjacent to the associated side of the POM-receiving receptacle 20 and the bullnose extension 22 (when used) of the faceplate 12. The thermal pad 26 may or may not be adhered or otherwise affixed to the side of the POM-receiving receptacle 20 and the bullnose extension 22 (when used) of the faceplate 12 and/or the planar spanning portion 24a of the durable slide cover 24. Finally, in this illustrative embodiment, the end of the planar spanning portion 24a or the end angled portion 24e includes a tab portion 24f that is configured to engage a slot of the associated side of the POM-receiving receptacle 20 or the bullnose extension 22 (when used) of the faceplate 12, thereby securing the durable slide cover 24 to the associated side of the POM-receiving receptacle 20 and the bullnose extension 22 (when used) of the faceplate 12 along with the screws, bolts, or the like 28. Other suitable securement methods are also contemplated herein.

Referring again to FIG. 3, at the back of the receptacle 20 are electrical connections for the POM 16. It should be noted that the receptacle 20 may be formed as part of the faceplate 12 or as a separate component.

Figure 7:
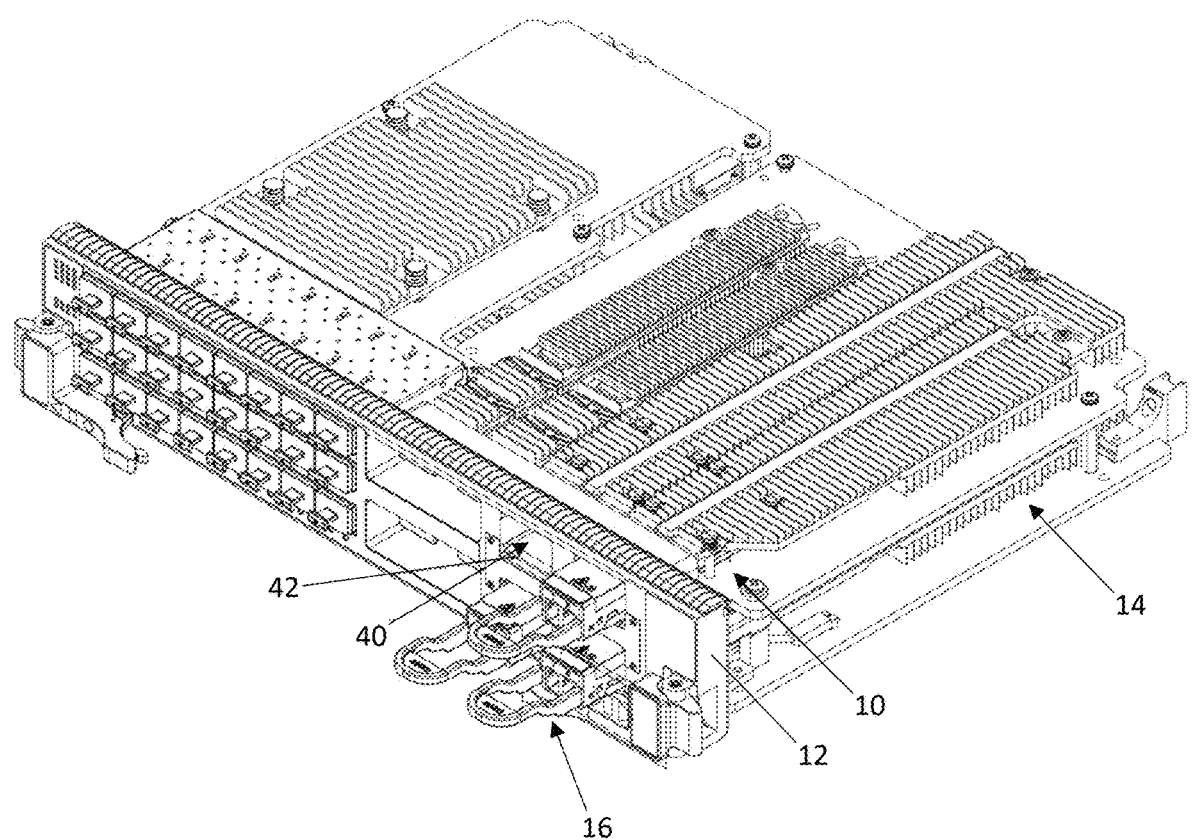
FIG. 7 is a perspective view of an optical system (circuit card) including a plurality of POMs, the system utilizing one illustrative embodiment of the faceplate heat sinks of the present disclosure.

Referring to FIG. 7, as an alternative or in addition to the above, the nose of the POM 16 may make thermal contact with a heat sink 40 in the receptacle 20 in the vicinity of the faceplate 12. This heat sink 40 transfers some POM heat to the moving air behind the faceplate 12, where convective heat transfer is more effective as compared to the forward-of-the-faceplate space.

Again, the module 10 includes the faceplate 12 disposed in front of the PCBs 14 of the module 10. Heat from the nose of the POM 16—the region to be cooled—is thus conducted to the heat sink 40 and the moving air behind the faceplate 12. Considering that the POM 16 is a device that is intended to be inserted and removed freely multiple times, and that there is always a small uncertainty in the gap width between POM and receptacle side wall, key attributes of the present disclosure include: thermal conductivity, elasticity, low compression set, low static and kinetic friction, and robustness.

The heat sink 40 is retained behind a front retention plate 42 affixed to the faceplate 12, optionally covered by the module label.

Referring to FIG. 8, a heat sink 40 may be provided below a top POM 16, towards a center axis of the faceplate 12, and above a bottom POM 16, towards the center axis of the faceplate 12, and this arrangement may be repeated for adjacent POM pairs, although other configurations may be utilized as well. Importantly, such arrangements expose the heat sinks 40 to the air flow behind the faceplate 12, which is typically along the center axis of the faceplate 12. Each heat sink 40 includes fins, pins, or other protrusions 44 reach through a corresponding opening in the faceplate/receptacle wall 46 into the rear-of-the-faceplate space by virtue of the opening in the faceplate/receptacle wall 46. In the arrangement illustrated, the upper fins 44 are oriented downwards through the opening in the faceplate/receptacle wall 46 and the lower fins 44 are oriented upwards through the opening in the faceplate/receptacle wall 46. The fins, pins, or other protrusions 44 may have any suitable geometry that increase cooling surface area and enhances heat exchange with the cooling air flow. The fins, pins, or other protrusions 44 penetrate deeply enough into the rear-of-the-faceplate space such that the forced air present provides a cooling benefit. The fin surface area and the air speed may be relatively small to be of benefit, as a relatively low heat transfer rate; e.g., less than 1 W; may be considered to be of benefit in this application, and may reduce the temperature of the nose of the POM 16 by several ° C., which is considered to be significant and important. The heat sink 40 may be manufactured from any material from which such heat sinks are typically manufactured.

Figure 9:
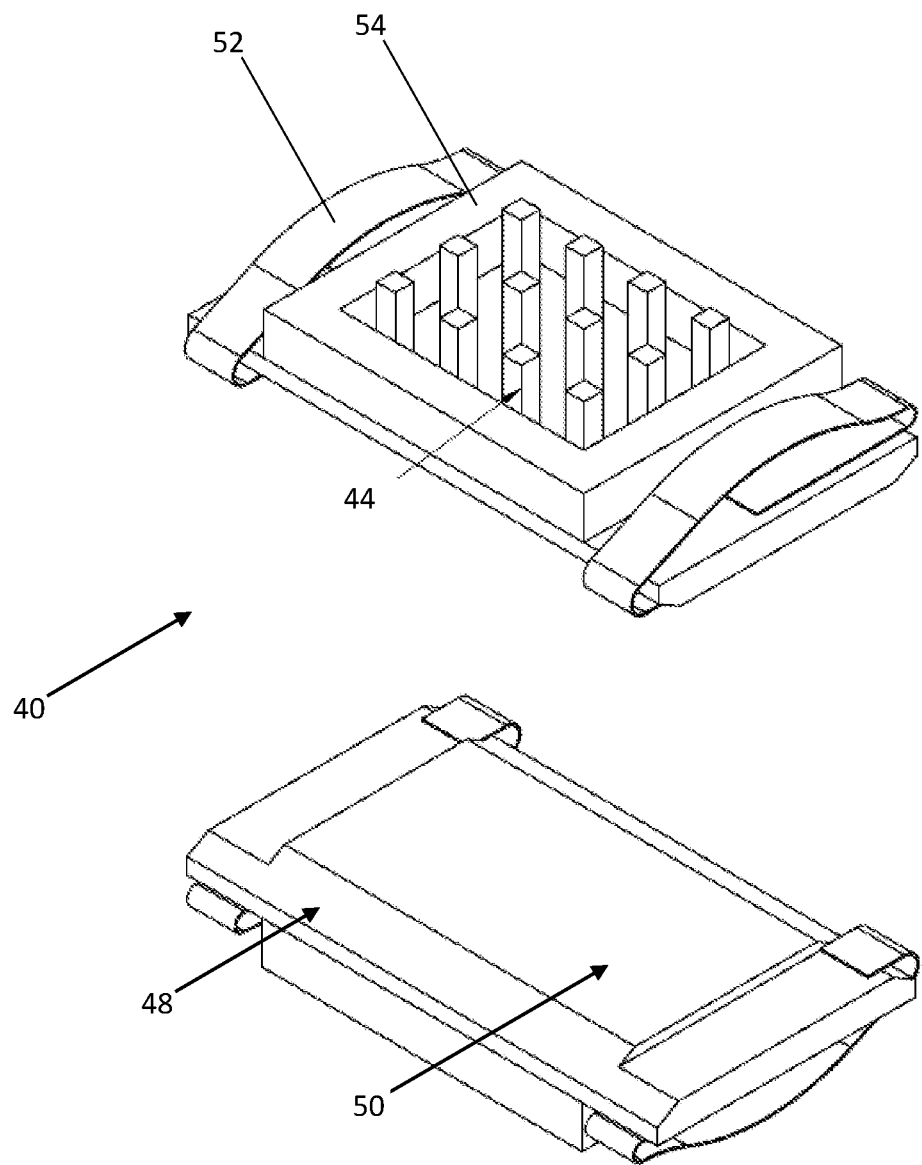
FIG. 9 is a perspective view of one illustrative embodiment of the faceplate heat sinks of FIG. 7.

Referring to FIGS. 8 and 9, the heat sink 40 is retained as part of the faceplate 12. The heat sink 40 has a lead-in feature 48; e.g., a chamfer; so that the POM 16 may be inserted freely along the axis orthogonal to the front of the faceplate 12. A contact surface 50 of the heat sink 40 is adapted to contact the associated POM 16 when the POM is inserted into the receptacle 20 past the lead-in feature 48. The heat sink 40 is spung using foam or metal members or springs 52 disposed on either side of the fins or pins 44 such that it bears against the inserted POM 16 with adequate pressure.

An EMI gasket 54 surrounds the fins or pins 44 and is used to prevent EMI noise from passing through the opening in the faceplate 12 that is used for passage of the fins or pins 44 through the faceplate/receptacle wall 46. An EMI gasket 54 with a donut topology is thus located between the base of the heat sink 40 and the faceplate/receptacle wall 46 in the space adjacent to the fins or pins 44 of the heat sink 40. The EMI gasket 54 may be manufactured from any material from which such EMI gaskets or shields are typically manufactured.

Referring to FIGS. 3 and 8, small openings or "mouse bites" 60 may be formed in the faceplate 12 to allow air to pass from the outside ambient into the rear-of-the-faceplate space through the faceplate 12. These openings 60 are formed near the rear of the receptacle 20. This is advantageous because in a forced convection system in which the fan(s) are downstream of the circuit card 10, the rear-of-the-faceplate space is at lower pressure than outside ambient, so air flows from the higher pressure to the lower pressure naturally. The resulting air speed across the surfaces of the nose of the POM 16 is thus much higher than if no "mouse bites" 60 are used. As a result, the heat transfer rate from the hot nose of the POM 16 to the adjacent ambient air is significantly improved.

The openings 60 are sized to be waveguides, such that the system Faraday cage is uncompromised. In an illustrative implementation, R=0.5 mm and L=3.0 mm are appropriate parameters, with R being the feature radius and L being the feature length orthogonal to the faceplate face. Typically, these waveguides are located in the space between the EMI fingers of the POM 16 and the faceplate opening for the corresponding POM 16. Any or all sides of the receptacle 20 proximate the rear of the receptacle 20 are suitable locations for the openings 60.

The openings 60 are simultaneously sized to be effective in moving air in a thermally-effective manner. A volume flowrate of 1 CFM is readily achievable and useful in lowering the POM nose temperature by several ° C., which is considered to be significant and important.

The openings 60 are also effective in a forced convection system in which the fan(s) are upstream of the circuit card 10. In this configuration, the rear-of-the-faceplate space is at a higher pressure than room ambient, and the direction of air flow through the openings 60 is from the rear-of-the-faceplate space to outside ambient.

Thus, the present disclosure addresses cooling involving the user-facing surfaces of POMs external to the Faraday cage of the associated module. Most current POM designs assume that air flow is front-to-back through the faceplate of a module in the system. In such cases, these user-facing surfaces typically see adequate air flow from the system to be cooled effectively. However, in a cross air flow system, where substantially no air passes through the faceplate of the module and is constrained within the Faraday cage, only minimal natural convection cooling is typically achieved from the user-facing surfaces of the POMs. By implementing the features of the present disclosure, natural convection no longer the primary cooling mechanism of a user-facing POM nose. If the thermal pad approach of the present disclosure is used, heat is conducted through the thermal pad to the cool faceplate, which is in turn cooled by the forced convection system air flow inside the module. If the heat sink of the present disclosure is used, the same principle applies, except that the heat transfer is more direct from the conductive contact between a POM and the associated heat sink, the heat sink being cooled by a forced convection system air flow inside the module. Further, the present disclosure provides ingress of air flow through the faceplate via openings adjacent to an EMI gasket, while serving to cool a surface outside the faceplate and continuing to meet the EMI shielding requirements.

Although the present disclosure is illustrated and described with reference to illustrative embodiments and specific examples, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following non-limiting claims for all purposes.

The invention claimed is:

1. An optical system comprising:
   a faceplate comprising a receptacle adapted to receive a pluggable optical module;

a thermal pad disposed adjacent to at least one interior side of the receptacle, wherein the thermal pad is adapted to be in thermal communication with the pluggable optical module when the pluggable optical module is received within the receptacle and conduct heat from a nose of the pluggable optical module to the faceplate; and a durable slide cover disposed over the thermal pad and affixed to the faceplate and adapted to be in physical contact with the pluggable optical module when the pluggable optical module is received within the receptacle, the durable slide cover thereby adapted to protect the underlying thermal pad from damage caused by the pluggable optical module when the pluggable optical module is inserted into and removed from the receptacle.

2. The optical system of claim 1, wherein the thermal pad comprises a graphite-over-foam pad.

3. The optical system of claim 1, wherein at least one side of the receptacle comprises a bullnose extension extending from a user-facing surface of the faceplate.

4. The optical system of claim 1, wherein the faceplate defines one or more openings in proximity to the receptacle adapted to allow air flow between a user-facing side and a back side of the faceplate.

5. The optical system of claim 4, wherein each of the one or more openings is sized to the allow air flow but acts as a waveguide to maintain electromagnetic shielding of the optical system by the faceplate.

6. An optical system comprising:
 a faceplate comprising a receptacle adapted to receive a pluggable optical module; and
 one or more of:
  a thermal pad disposed adjacent to at least one interior side of the receptacle, wherein the thermal pad is adapted to be in thermal communication with the pluggable optical module when the pluggable optical module is received within the receptacle and conduct heat from a nose of the pluggable optical module to the faceplate; and
  a heat sink disposed at an interior side of the receptacle, wherein the heatsink is adapted to be in physical contact and thermal communication with the pluggable optical module when the pluggable optical module is received within the receptacle and conduct the heat from the nose of the pluggable optical module to an air flow present behind the faceplate;
 wherein at least one side of the receptacle comprises a bullnose extension extending from a user-facing surface of the faceplate.

7. The optical system of claim 6, wherein the thermal pad comprises a graphite-over-foam pad.

8. The optical system of claim 6, further comprising a durable slide cover disposed over the thermal pad and affixed to the faceplate and adapted to be in physical contact with the pluggable optical module when the pluggable optical module is received within the receptacle, the durable slide cover thereby adapted to protect the underlying thermal pad from damage caused by the pluggable optical module when the pluggable optical module is inserted into and removed from the receptacle.

9. The optical system of claim 6, wherein the heat sink comprises a planar surface adapted to contact the pluggable optical module when the pluggable optical module is received within the receptacle and a plurality of fins, pins, or other protruding structures extending from the planar surface through an opening formed in a wall of the receptacle, the plurality of fins, pins, or other protruding structures extending into the air flow present behind the faceplate.

10. The optical system of claim 9, further comprising:
 one or more spring members disposed between the planar surface of the heat sink and the wall of the receptacle and adapted to bias the planar surface into the pluggable optical module when the pluggable optical module is received within the receptacle; and
 an electromagnetic interference gasket disposed between the planar surface of the heat sink and the wall of the receptacle around the opening and the plurality of fins, pins, or other protruding structures.

11. The optical system of claim 6, wherein the faceplate defines one or more openings in proximity to the receptacle adapted to allow air flow between a user-facing side and a back side of the faceplate, wherein each of the one or more openings is sized to allow the air flow but acts as a waveguide to maintain electromagnetic shielding of the optical system by the faceplate.

\* \* \* \* \*